United States Patent
Wolter et al.

(10) Patent No.: US 9,045,329 B2
(45) Date of Patent: Jun. 2, 2015

(54) MICROMECHANICAL ELEMENT WHICH CAN BE DEFLECTED

(75) Inventors: Alexander Wolter, Dresden (DE); Thomas Klose, Dresden (DE)

(73) Assignee: Fraunhofer-Gesellschaft zur Förderung der angewandten Forschung E.V., München (DE)

( * ) Notice: Subject to any disclaimer, the term of this patent is extended or adjusted under 35 U.S.C. 154(b) by 1286 days.

(21) Appl. No.: 12/093,834

(22) PCT Filed: Nov. 25, 2005

(86) PCT No.: PCT/DE2005/002182
§ 371 (c)(1),
(2), (4) Date: Jun. 30, 2008

(87) PCT Pub. No.: WO2007/059718
PCT Pub. Date: May 31, 2007

(65) Prior Publication Data
US 2008/0284078 A1  Nov. 20, 2008

(51) Int. Cl.
*G02B 26/08* (2006.01)
*B81B 3/00* (2006.01)

(52) U.S. Cl.
CPC ............. *B81B 3/0062* (2013.01); *G02B 26/08* (2013.01)

(58) Field of Classification Search
CPC .............................. B81B 3/0062; G02B 26/08
USPC .......... 248/608, 560, 603, 605, 606; 267/154; 359/224, 224.2, 223.1, 224.1; 310/309
See application file for complete search history.

(56) References Cited

U.S. PATENT DOCUMENTS

| | | | | |
|---|---|---|---|---|
| 5,917,647 A | * | 6/1999 | Yoon | 359/298 |
| 5,978,128 A | * | 11/1999 | Yoon | 359/298 |
| 5,992,233 A | * | 11/1999 | Clark | 73/514.35 |
| 6,242,989 B1 | * | 6/2001 | Barber et al. | 331/177 V |

(Continued)

FOREIGN PATENT DOCUMENTS

| | | |
|---|---|---|
| CN | 2424450 Y | 3/2001 |
| CN | 1620626 A | 5/2005 |
| EP | 1486999 A2 | 12/2004 |

OTHER PUBLICATIONS

Chinese Office Action for corresponding Chinese Patent Application, No. 200580052156.3, Apr. 22, 2010.

(Continued)

*Primary Examiner* — Christopher Garft
(74) *Attorney, Agent, or Firm* — Matthew B. Dernier, Esq.; Gibson & Dernier LLP

(57) ABSTRACT

The invention relates to deflectable micromechanical elements which can preferably be deflected in translation and optionally also in an oscillatory manner. With respect to known solutions, it is the object of the invention to enable larger deflections with a simultaneously improved resistance toward lateral forces and torques. In this connection, a suspension having at least one spring system is present at elements in accordance with the invention. Levers pivotally connected to torsion spring elements are present at spring systems. Torsion spring elements of a spring system are aligned in a common axis and/or a plurality of axes arranged parallel to one another and at least one torsion spring element is fixedly clamped.

21 Claims, 8 Drawing Sheets

(56) References Cited

U.S. PATENT DOCUMENTS

| | | | | |
|---|---|---|---|---|
| 6,296,779 | B1* | 10/2001 | Clark et al. | 216/66 |
| 6,724,023 | B2* | 4/2004 | Heyers et al. | 257/254 |
| 6,868,726 | B2* | 3/2005 | Lemkin et al. | 73/514.32 |
| 7,369,288 | B2* | 5/2008 | Wolter et al. | 359/224.1 |
| 7,432,629 | B2* | 10/2008 | Mala et al. | 310/309 |
| 2003/0099082 | A1* | 5/2003 | Tuo et al. | 361/290 |
| 2004/0090143 | A1 | 5/2004 | Miller | |
| 2005/0094931 | A1 | 5/2005 | Yokoyama et al. | |
| 2006/0071578 | A1* | 4/2006 | Drabe et al. | 310/309 |

OTHER PUBLICATIONS

"Micromechanical Devices with Embedded Electro-Thermal-Complaint Actuation" by T. Moulton, et al., Sonsors and Actuators A. pp. 38-48 (2001) Switzerland.

International Preliminary Report on Patentability and Written Opinion for International Application PCT/DE2005/002182 dated Jul. 8, 2008.

International Search Report for International Application PCT/DE2005/002182 dated Aug. 4, 2006.

\* cited by examiner

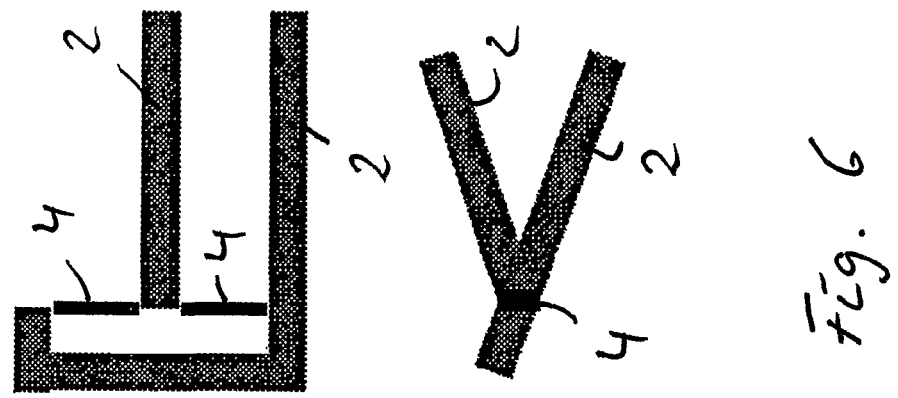
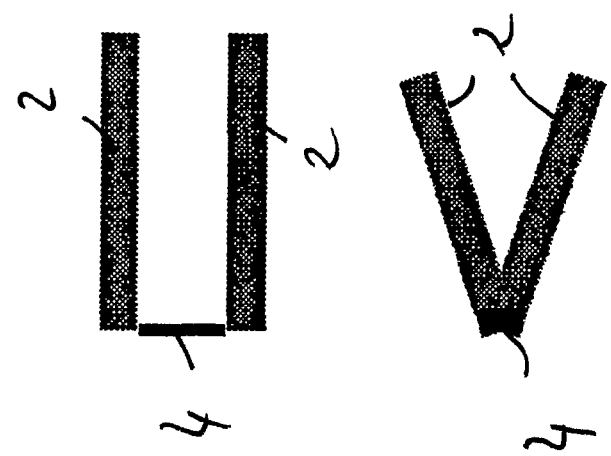
fig. 6

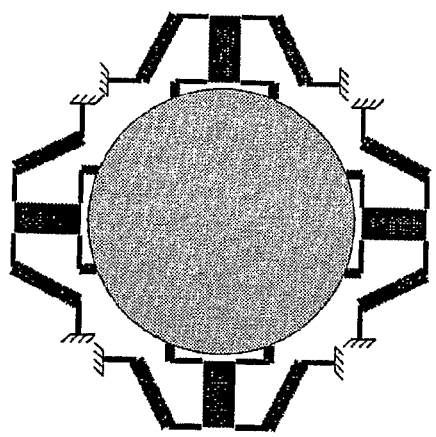
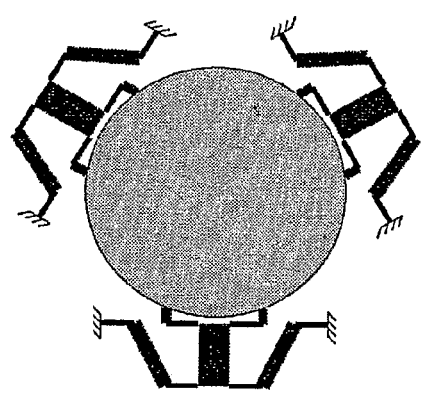
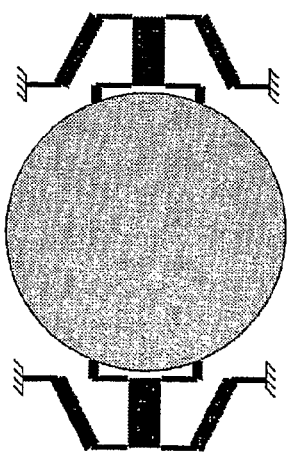
Fig. 7

MICROMECHANICAL ELEMENT WHICH CAN BE DEFLECTED

BACKGROUND

The invention relates to deflectable micromechanical elements. In this connection, the deflection can take place in translation along an axis, but also by pivoting around an axis. On a translatory deflection, the respective axis is in particular aligned orthogonally to the plane of the micromechanical element. The deflection can also take place in an oscillating manner. Drive concepts known per se such as electrostatic drive concepts can be used for the deflection.

With the last-named elements, also called translation oscillators, they are suspended at springs and should not be inclined on the translatory deflection. Straight or folded bending springs are used for the springs. In this connection, a high stiffness for lateral forces, the resistance to tensile forces and torsional moments should be high. In contrast to this, it is desired to use springs which are soft in the direction of deflection.

As a rule, such elements with suspension are made in planar technology from a common substrate. In this connection, they are substantially etched two-dimensionally from a layer.

It is known of straight bending springs that the tensile force influence becomes more important with large deflections in them. Accordingly, the spring constant increases with a higher deflection. Such bending springs thus have a progressive spring characteristic. The length of such bending springs is increased to reduce this effect, which increases the required construction size.

Alternatively, this can also be achieved by folding or by forming so-called serpentine springs. However, such springs bend or twist easily.

Some parameters are available to improve the suspension with respect to its spring effect. It is, however, only possible with difficulty to select or design a spring or a spring system which is sufficiently soft in the deflection direction, but is resistant toward influences of lateral force, tensile force or torque in other axial directions. In this connection, the low thickness of the useful substrate material from which such elements are made by etching also has an aggravating effect.

With suspensions of known solutions, different spring elements are in particular used with micromechanical elements which are deflectable in translation. They are, for example, bar springs (four-spring elements, eight-spring elements, cross-spring elements, etc.), angular springs, meandering springs or serpentine springs.

However, all these known solutions have disadvantages. This relates to a high effort and/or expense for the construction and manufacture, to the insufficient stiffness in certain axial directions or toward torques as well as to an unwanted non-linearity of the spring characteristic.

SUMMARY OF THE INVENTION

It is therefore the object of the invention to provide a micromechanical element which is deflectable in an oscillating manner and which is also insensitive toward lateral forces and torsion moments even at larger deflections.

In accordance with the invention, this object is solved by an element having the features of claim 1. Advantageous embodiments and further developments of the invention can be achieved using features designated in the subordinate claims.

With elements in accordance with the invention, a suspension is present at a micromechanical element to be deflected, said suspension being formed with at least one spring system. In a spring system, levers are pivotally connected to torsion spring elements. All the torsion spring elements are aligned in a common axis and/or in a plurality of axes aligned parallel to one another. At least one torsion spring element is fixed in a fixed clamp.

In this connection, torsion spring elements also form joints between mutually connected levers and can be formed easily and simply using the known technologies. In this connection, they can be manufactured in the form of bars and they can be influenced with respect to their spring force effect by observation of certain cross-sections. Different cross-sections can thus also be taken into account along their longitudinal axis with respect to the geometry and to the dimensioning of the cross-section.

The levers are made in accordance with the manufacturing technology of the same substrate and of the same material as torsion spring elements. However, in their cross-sectional geometry they are made such that they have a much higher mechanical resistance torque than torsion spring elements at least in an axial direction.

In the non-deflected state of a micromechanical element, the micromechanical element, the levers and also the torsion spring elements can be arranged in a common plane.

A suspension of a deflectable micromechanical element can be formed with two spring systems which can be made the same and can be arranged symmetrical to one another. More than two spring systems should be arranged at respectively equal angular distances to one another and have a corresponding angular direction.

Spring systems should furthermore be made symmetrical with respect to an axis which is aligned orthogonally to the axis/axes of torsion spring elements. They should be arranged centrally between fixed clamps of torsion spring elements.

Fixed clamps of torsion spring elements should have a lever arm which is as large as possible and should therefore observe a spacing which is at least as large as ⅔ of the extent of the micromechanical element in the region at which the respective spring system engages. Larger spacings of such fixed clamps of a spring system are, however, to be preferred.

The invention can moreover be advantageously further developed and in particular the stiffness in certain axial directions can be increased in that levers already connected to torsion spring elements are additionally connected by means of stiffening elements.

In addition to the connection of levers by means of torsion spring elements, they can also be connected using bending spring elements. Bending spring elements can preferably engage directly at the micromechanical element.

The invention can be used for sensors, but also for actuators. This can, for example, take place as an accelerometer, a path length modulator or also as a pivotable reflecting element (micro mirror). On an application for optical path length modulation, the invention can thus be used in confocal microscopes, Fourier transform spectrometers or also in optical coherence tomography (OCT).

Deflectable elements can moreover be mirrors, also semi-permeable, masses, the frame of optical elements (optical lenses), a diaphragm, a zone plate, shutters, a diffraction grid or aerodynamic bodies.

The invention can also be used as an oscillator in accelerometers, in rotational speed sensors, viscosity sensors or as a balance spring.

With respect to known solutions, the invention is advantageously characterized in that forces dependent on the deflection do not necessarily have to be applied by means of additional spring elements on the movement.

In contrast to bending spring elements, practically linear oscillators can be realized by the use of torsion spring elements which behave in an at least approximately linear manner (resetting torque increases linearly with the torsional angle).

A suspension or a spring system can be made wholly or partly in the form of a pantograph structure in this connection.

Larger deflections of micromechanical elements can be realized with comparable tensions using the suspension. The design and the conceptualization are simplified since the active, i.e. the deformed, structure (torsion spring element) is of a substantially simpler nature than geometrically more complex non-linear bending structures.

The required space requirements can likewise be reduced.

Spring systems which can be used in the invention can be connected to further levers which can form a lever structure. They can be made in a conventional shape, e.g. in the form of one or more serpentines.

In a possible embodiment, individual levers can also be made in a locally defined manner such that a bending of such selected levers is possible at the respective positions and said levers can form bending springs.

BRIEF DESCRIPTION OF THE DRAWINGS

The invention should be explained in the following with reference to examples.

There are shown:

FIG. 6—two examples of pivotal connections of levers in two views;

FIG. 7—three examples with more than one spring system forming a suspension.

Figure 1:
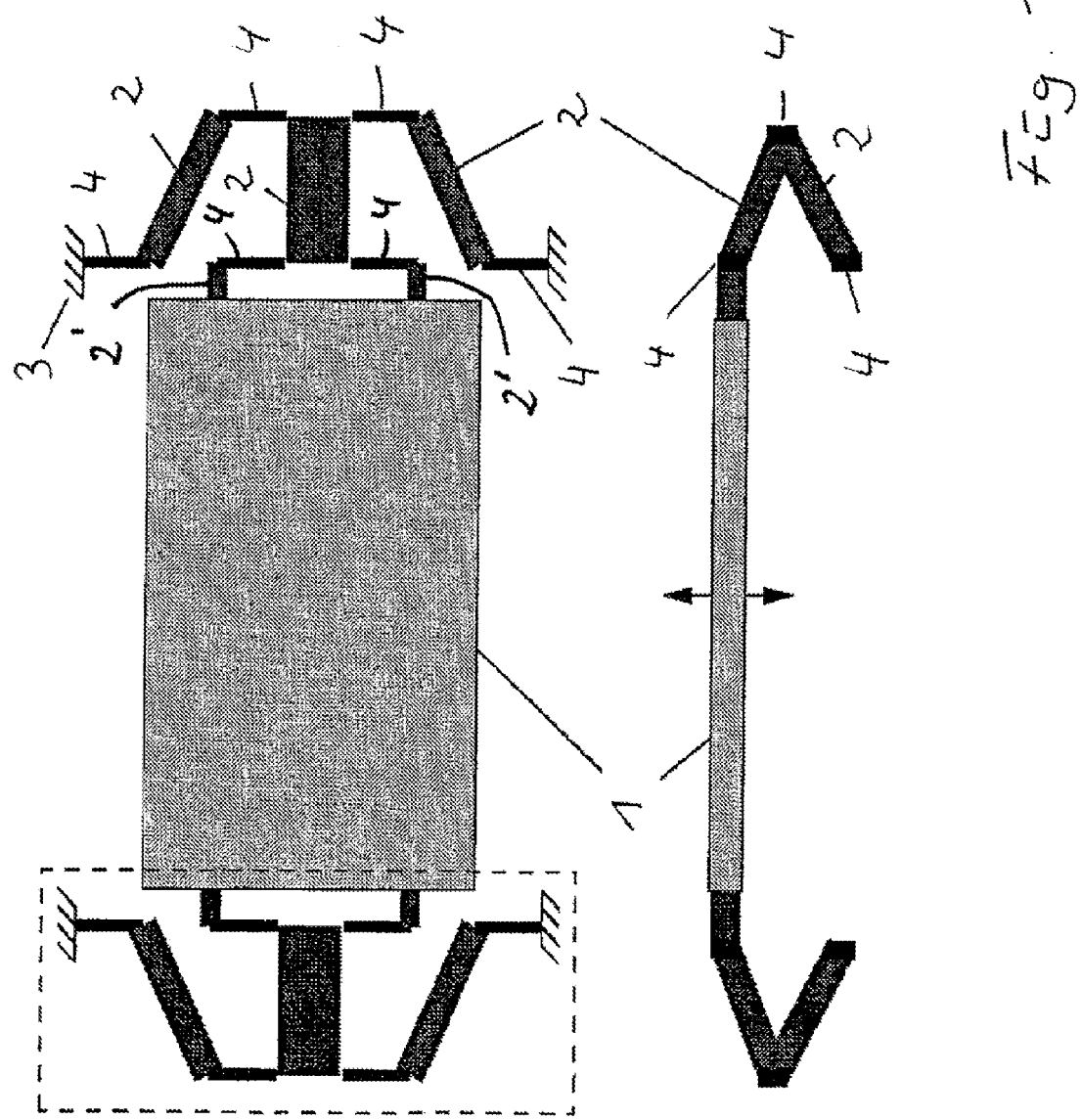
FIG. 1—an example of an element in accordance with the invention in two views, with the lower representation showing a micromechanical element deflected in translation in a side view.

Not all elements are provided with the respective reference numerals in the Figures.

DETAILED DESCRIPTION OF THE INVENTION

An example of an element in accordance with the invention is shown in two views in FIG. 1. In the plan view shown at the top, it becomes clear that a suspension of a micromechanical element 1 having two spring systems is formed which are arranged diametrically opposite at the micromechanical element 1 and engage thereat via levers 2'. At a side of the lever 2, the levers 2' are pivotally connected to the lever 2 by means of torsion spring elements 4. At the other side of this lever 2, two torsion spring elements 4 are again connected to this and two respective further levers 2 for a pivotal connection. The last-named levers 2 are inclined at an oblique angle with respect to the axis of the torsion spring elements 4. At its other end, torsion spring elements 4 are again present which are connected at one side to the end faces of these levers 2 and are accordingly held at the other side in fixed clamps 3.

The lower representation shows a deflected micromechanical element 1. The deflection in translation is indicated with the corresponding movement axis by the double arrow.

As can be seen from the lower representation of FIG. 1, no bending of the levers 2 and 2' takes place on the deflection of the micromechanical element 1 and the spring effect is achieved only by the torsion spring elements 4.

In this example, each of the two spring systems forms a pantograph structure.

Figure 2:
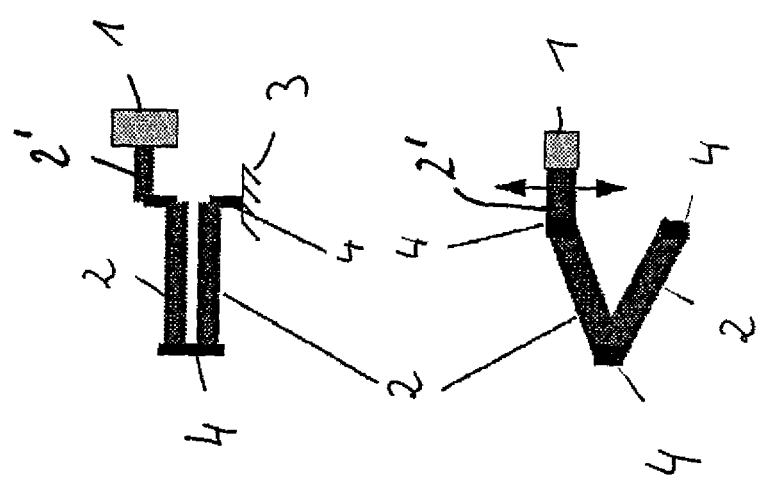
FIG. 2—in a schematic form, likewise in two views, a simple spring system for a suspension.

A simple structure of a spring system is likewise shown in two views in FIG. 2. In this connection, a mechanical element 1 is connected to a first lever 2'. The other end face of this lever 2' is pivotally connected to a torsion spring element 4 and this is in turn connected to a further lever 2. This lever 2 and a lever 2 aligned parallel thereto, here with the same length and dimensioning, are pivotally connected to a torsion spring element 4.

A torsion spring element 4 connected to the one lever 2 is held in the fixed clamp.

The lower representation of FIG. 2 again shows a deflected position of a micromechanical element 1 and the levers 2 pivoted around the longitudinal axes of the torsion spring elements 4.

A simple pantographic suspension is shown schematically in FIG. 2.

Figure 3:
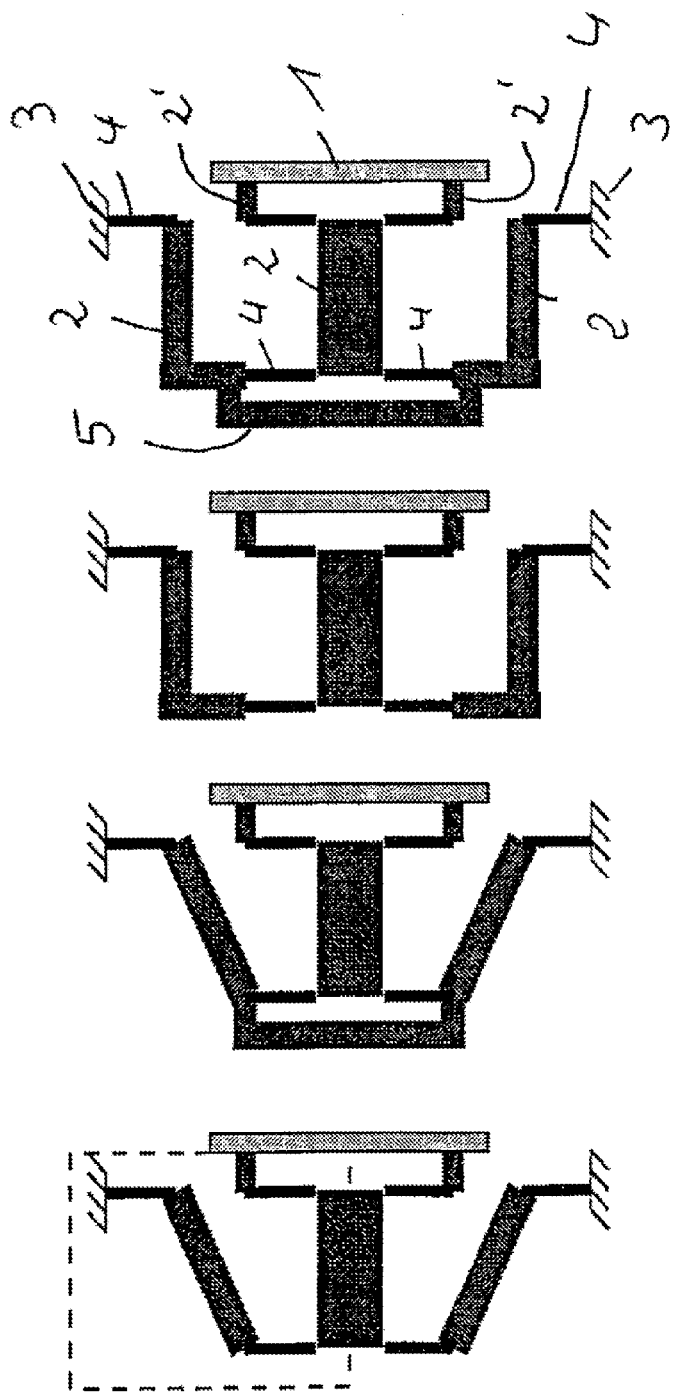
FIG. 3—four further examples of spring systems.

FIG. 3 shows four examples with one respective spring system at a micromechanical element 1. In this connection, the example shown at the far left substantially corresponds to a spring system such as was also designed in an example shown in FIG. 1.

In the example shown second from the left in FIG. 3, the levers 2 aligned at an obliquely inclined angle are additionally connected to a stiffening element 5 for the pivotal connection to torsion spring elements 4.

The two examples shown at the right in FIG. 3 utilize levers 2 and 2' aligned at least partly parallel to one another. In this connection, two of these levers 2 are made in angled form and, in the example shown at the far right, are additionally likewise connected to a stiffening element 5 in addition to the torsion spring elements 4.

The lateral stiffness can in particular be increased by the action of such stiffening elements 5.

As indicated in the left hand representation of FIG. 3 by the dashed line, such a spring system is made symmetrical and the part of the spring system disposed within this region forms a pantograph structure which in turn finds it symmetrical counterpart at the other side.

This circumstance applies to all four examples shown in FIG. 3.

Figure 4:
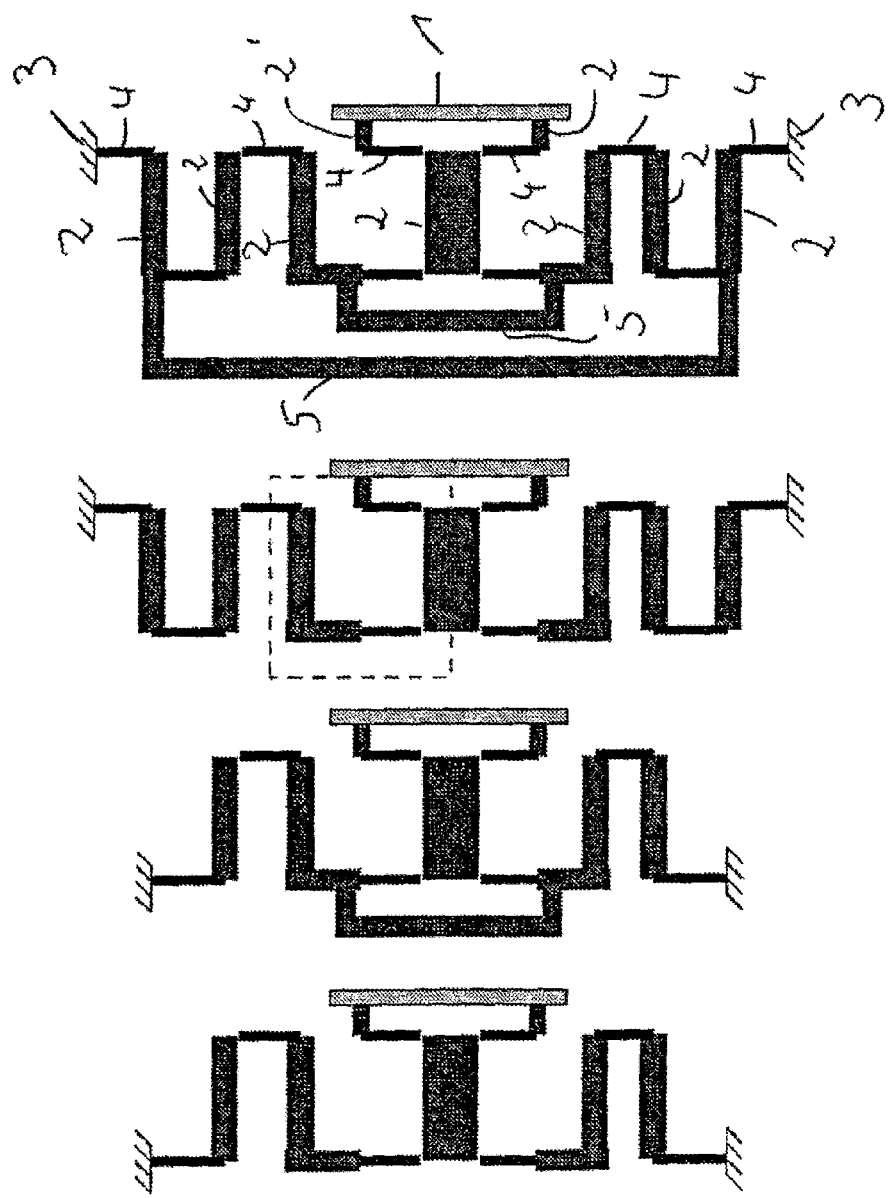
FIG. 4—four further examples of spring systems with an arrangement in rows.

FIG. 4 shows more complexly formed spring systems at a micromechanical element 1. In this connection, a kind of row arrangement which can be formed of a plurality of pantographs is provided by a plurality of levers 2 and 2' as well as by torsion spring elements 4 pivotally connected thereto. In this connection, such a pantograph is again marked in the second representation from the right by the region enclosed by a dashed line. In the example second from the left and at the far right, stiffening elements 5 are again present which additionally connect levers 2 to one another. In the example shown at the far right, two such stiffening elements 5 are formed.

With such a structure of spring systems, an additional lever structure can also be added, in a form not shown, which is possible in the form of one and a half pantographs.

To achieve a higher stiffness, two such structures can be connected to one another and arranged next to one another. In this connection, symmetrical, movable parts should be connected to one another.

The maximum deflection of the micromechanical element 1 can be increased by such a row arrangement without extending the individual levers 2 and 2'. The compact design can thus be increased.

Figure 5:
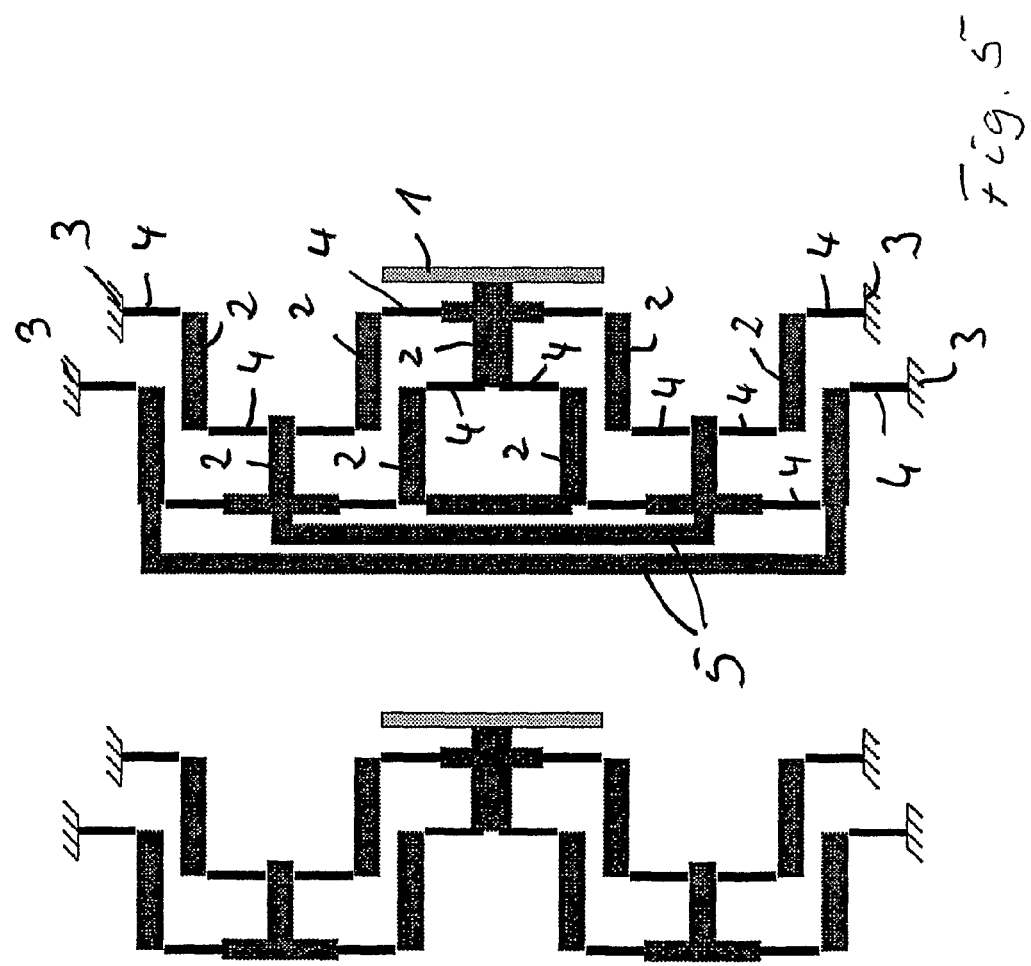
FIG. 5—two examples of spring systems with an interleaved parallel arrangement.

Two further examples for spring systems which can be used as elements in accordance with the invention are shown in FIG. 5. Stiffening elements 5 are also connected symmetrically to levers 2 here in the example shown at the right. In this connection, an arrangement of interleaved pantograph structures is selected in the two examples. The ends are kept parallel in this connection. It is thus possible to speak of a "parallel connection". A micromechanical element 1 oscillating in translation and having only two pantograph structures thereby becomes more stable with respect to tilting. This embodiment has the advantage of more compact individual elements and of a total compact design with respect to one having more than two suspensions/spring systems which would likewise avoid the tilting.

The joints at pantographs and spring systems realized by torsion spring elements 4 can be used in two embodiments. This is illustrated in FIG. 6. A torsion spring element 4 is simply connected to two levers 2 at the same end faces in the left hand representation. The levers 2 are parallel next to one another in the non-deflected state. A deflection is shown in the lower left hand representation. Two torsion spring elements 4 are present in the right hand representation of FIG. 6. A lever 2 is connected to a lower torsion spring element 4 and a further torsion spring element 4 is connected to a lever arm as an example for a stiffening. The lower right hand representation again shows such an embodiment in deflection. The advantage of the embodiment shown at the right here can be found in an increased lateral stiffness.

Possibilities of the arrangement of a plurality of spring systems as a suspension for a micromechanical element 1, made in circular form here, should be indicated by FIG. 7. Two spring systems are disposed diametrically opposite one another in the example arranged at the left. A symmetrical arrangement of three spring systems at such a micromechanical element 1 is shown in the middle. The spring systems are arranged at equal angular spacings from one another so that a symmetry can also be maintained around the center of the micromechanical element 1. In the example shown at the far right, two pairs of spring systems are present which are each disposed diametrically opposite one another. In these examples, the oscillating translatory movement of the micromechanical elements 1 takes place out of the drawing plane and into the drawing plane.

Generally, levers 2 and 2', which can be used in the invention, can also have any desired shapes such as triangular or trapezoid. They should, however, be stiffer than the joints or torsion spring elements 4.

When dynamic deformations of a micromechanical element 1 pivoted around an axis take place with micromechanical elements 1 oscillating around an axis, said dynamic deformations caused by inertia, these can be reduced by the arrangement of additional spring elements outside the torsion axis. Spring systems having a pantograph structure are very suitable for this purpose since a large deflection can be achieved with simultaneously small space requirements and a linear spring behavior.

Figure 8:
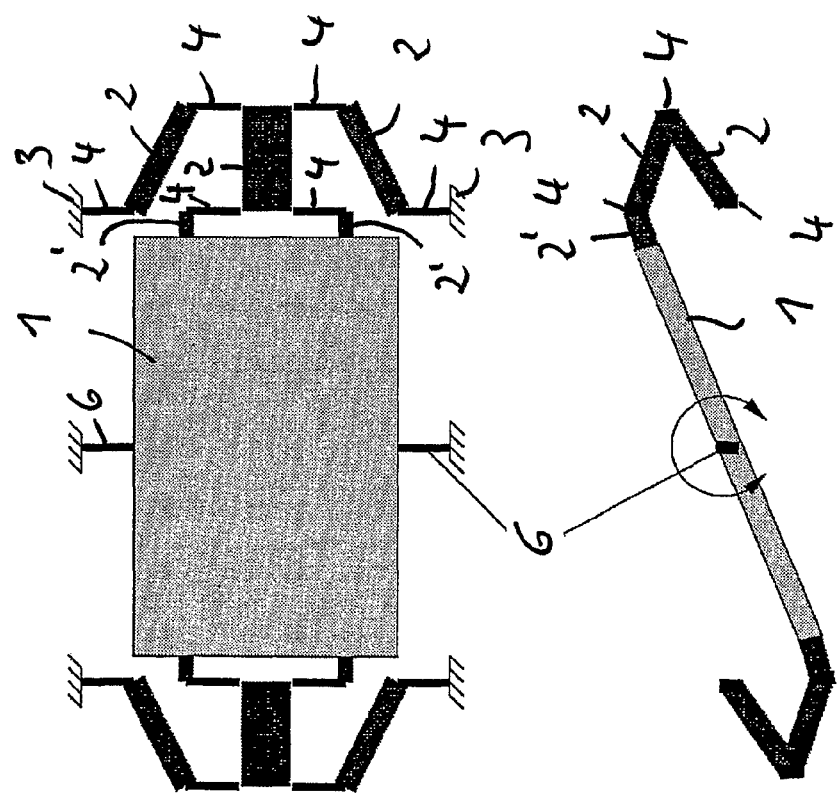
FIG. 8—two views of an example with a micromechanical element pivotable around an axis.

A corresponding example is shown in FIG. 8. In this connection, the suspension of a micromechanical element 1 which can be pivoted in an oscillating manner around a torsion axis can be formed with two spring systems which were also used in the example of FIG. 1. In addition, two torsion springs 6 are present at the micromechanical element 1 which are disposed in the same plane as the levers 2, 2' and the torsion spring elements 4 in the non-deflected state. The torsion springs 6 are arranged in the torsion axis of the micromechanical element 1.

A deflected position is again shown in the lower representation of FIG. 8.

The invention claimed is:

1. A deflectable micromechanical element, comprising:
   a substrate defining a plane, where a first axis extends parallel to the substrate and a second axis extends parallel to the substrate and orthogonal to the first axis; and
   a suspension supporting the substrate and including at least first and second spring systems, wherein:
   each of the first and second spring systems is formed with levers which are pivotally connected to torsion spring elements, such that the substrate is permitted to exhibit oscillating translation deflection movement in a direction perpendicular to the plane of the substrate, and the levers have a larger mechanical resistance torque than the torsion spring elements in the perpendicular direction of the substrate,
   at least one of the levers of each of the first and second spring systems extends parallel to the first axis and directly engages a respective peripheral edge of the substrate,
   at least one of the torsion spring elements of each of the first and second spring systems is fixedly clamped at one end thereof,
   the torsion spring elements of each of the first and second spring systems are aligned parallel to the second axis and orthogonal to the first axis,
   the respective levers and torsion spring elements of each of the first and second spring systems are arranged symmetrically about the first axis, such that the first axis is an axis of symmetry of the micromechanical element.

2. An element in accordance with claim 1, wherein the levers and the torsion spring elements are made of a common material.

3. An element in accordance with claim 1, wherein the at least first and second spring systems are arranged on a common peripheral edge of the substrate.

4. An element in accordance with claim 1, wherein the at least one of the torsion spring elements of each of the first and second spring systems are fixedly clamped at respective positions diametrically opposite one another on respective sides of the first axis.

5. An element in accordance with claim 1, wherein:
   the at least one of the levers of the first spring system extends parallel to the first axis and directly engages a first peripheral edge of the substrate: and
   the at least one of the levers of each of the second spring system extends parallel to the first axis and directly engages a second peripheral edge of the substrate; opposite to the first peripheral edge of the substrate.

6. An element in accordance with claim 4, wherein the respective positions at which the at least one of the torsion spring elements of each of the first and second spring systems are arranged at a spacing from one another which is at least as large as ⅔ of an extent of the micromechanical element in a region at which the first and second spring systems engage the substrate.

7. An element in accordance with claim 1, wherein levers connected to the torsion spring elements are additionally connected to stiffening elements.

8. An element in accordance with claim 1, wherein the at least one of the levers of the first spring system is one lever that engages the substrate on one side of the first axis, and the at least one of the levers of the second spring system is one lever that engages the substrate on an opposite side of the first axis.

9. An element in accordance with claim 1, further comprising first and second torsional springs oriented parallel to the second axis, wherein:
   the first torsional spring directly engages a first further peripheral edge of the micromechanical element; and
   the second torsional spring directly engages a second further peripheral edge of the micromechanical element, opposite to the first further peripheral edge.

10. An element in accordance with claim 1, wherein the substrate, as well as all levers and torsion spring elements, are in the plane in a non-deflected state of the substrate.

11. An element in accordance with claim 1, wherein each of the torsion spring elements have a cross-section varying along a longitudinal axis thereof.

12. An element in accordance with claim 1, wherein the levers of the at least one spring system are connected to bending spring elements.

13. An element in accordance with claim 1, wherein the levers the at least one of the levers of each of the first and second spring systems engaging the substrate are designed as bending spring elements.

14. An element in accordance with claim 1, wherein at least some of the torsion spring elements of each of the first and second spring systems are arranged in a plurality of axes aligned parallel to one another and at different spacings from the substrate.

15. An element in accordance with claim 1, further comprising at least one further spring system arranged at respective distances from the first and second spring systems, where the respective distances are substantially equal to one another.

16. An element in accordance with claim 1, wherein each of the first and second spring systems is formed with the levers and torsion spring elements in such a way that the levers and torsion spring elements form a plurality of respective interleaved and parallel groups of the levers and torsion spring elements.

17. An element in accordance with claim 1, wherein one or more spring system(s) are connected to further levers which form a lever structure.

18. An element in accordance with claim 17, wherein the lever structure(s) is/are made in the form of a serpentine.

19. An element in accordance with claim 1, wherein the levers are bendable in a locally defined manner in the deflection direction at one or more spring system(s).

20. An element in accordance with claim 1, wherein the element is made as a sensor or as an actuator.

21. An element in accordance with claim 1, wherein:
   each of the torsion spring elements is elongate along an axis thereof and exhibiting torsional spring action about the axis,
   wherein respective axes of the torsion spring elements are orthogonal to the first axis.

* * * * *